United States Patent
Kern et al.

(10) Patent No.: US 11,722,153 B2
(45) Date of Patent: Aug. 8, 2023

(54) CORRECTION OF BIT ERRORS

(71) Applicant: Infineon Technologies AG, Neubiberg (DE)

(72) Inventors: Thomas Kern, Aschheim (DE); Michael Goessel, Mahlow (DE); Thomas Rabenalt, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/579,721

(22) Filed: Jan. 20, 2022

(65) Prior Publication Data

US 2022/0231704 A1 Jul. 21, 2022

(30) Foreign Application Priority Data

Jan. 20, 2021 (DE) .................... 10 2021 101 157.4
Dec. 17, 2021 (DE) .................... 10 2021 133 678.3

(51) Int. Cl.
*H03M 13/00* (2006.01)
*H03M 13/15* (2006.01)

(52) U.S. Cl.
CPC ..... *H03M 13/1575* (2013.01); *H03M 13/152* (2013.01)

(58) Field of Classification Search
CPC .......... H03M 13/1575; H03M 13/152; H03M 13/151; H04L 1/0057
See application file for complete search history.

(56) References Cited

U.S. PATENT DOCUMENTS

| | | | |
|---|---|---|---|
| 4,502,141 A * | 2/1985 | Kuki | H03M 13/15 714/782 |
| 5,329,535 A | 7/1994 | Coker | |
| 5,898,708 A * | 4/1999 | Tateishi | H03M 13/151 714/755 |
| 7,231,579 B1 * | 6/2007 | Pines | H03M 13/175 714/761 |
| 7,587,658 B1 * | 9/2009 | Tong | G06F 11/1012 714/763 |
| 7,725,800 B2 * | 5/2010 | Yang | H03M 13/3784 714/755 |
| 8,281,188 B2 * | 10/2012 | Miller | G06F 11/10 719/327 |

(Continued)

OTHER PUBLICATIONS

Wikipedia.org "BCH Code" Published on Aug. 8, 2021.
(Continued)

*Primary Examiner* — Esaw T Abraham
(74) *Attorney, Agent, or Firm* — Eschweiler & Potashnik, LLC

(57) ABSTRACT

Processing of a bit sequence is proposed, wherein (i) a first partial error syndrome $s_1$ of an error syndrome and a second partial error syndrome $s_2$ of the error syndrome are determined for the bit sequence, (ii) a first comparison value is determined on the basis of a bit position and the first partial error syndrome, (iii) a second comparison value is determined on the basis of the bit position and the second partial error syndrome, and (iv) the bit position is corrected should a comparison of the first comparison value with the second comparison value assume a specified value and otherwise the bit position is not corrected.

26 Claims, 6 Drawing Sheets

(56) References Cited

U.S. PATENT DOCUMENTS

| | | | | |
|---|---|---|---|---|
| 8,539,321 | B2* | 9/2013 | Kern | H03M 13/155 |
| | | | | 714/781 |
| 8,631,308 | B2* | 1/2014 | Goessel | H03M 13/21 |
| | | | | 714/755 |
| 8,943,391 | B2* | 1/2015 | Lin | H03M 13/451 |
| | | | | 714/785 |
| 9,391,641 | B2* | 7/2016 | Subramanian | H03M 13/152 |
| 9,450,613 | B2* | 9/2016 | Kern | H03M 13/159 |
| 10,998,920 | B1* | 5/2021 | Tate | H03M 13/1111 |
| 11,239,944 | B1* | 2/2022 | Pan | H04L 1/0042 |
| 2019/0132006 | A1 | 5/2019 | Kern et al. | |

OTHER PUBLICATIONS

Lin et al. "Error Control Coding: Fundamentals & Applications" Prentice-Hall, Inc., ISBN 0-13-283796-X, pp. 153-169, published in 1983.

Okano et al. "A Construction Method of High Speed Decoders Using ROM's for Bose-Chaudhuri-Hocquenghem and Reed-Solomon Codes" IEEE Transactions on Computers, vol. C-36, No. 10, published Oct. 1987.

* cited by examiner

CORRECTION OF BIT ERRORS

REFERENCE TO RELATED APPLICATIONS

This Application claims priority to German Application number 10 2021 101 157.4, filed on Jan. 20, 2021 and German Application number 10 2021 133 678.3, filed on Dec. 17, 2021. The contents of the above-referenced Patent Applications are hereby incorporated by reference in their entirety.

TECHNICAL FIELD

The correction and/or detection of bit errors in binary data, for example sequences of a plurality of bits, using error codes is known.

BACKGROUND

An error code can be an error-correcting code, an error-detecting code, or a combination of an error-detecting and error-correcting code. An example of an error code is the Bose-Chaudhuri-Hocquenghem (BCH) code.

In the context of a BCH code, bit error positions can be corrected based on the zeros of a locator polynomial of the BCH code. A specific procedure for 2-bit error correction in a Galois field $GF(2^m)$ can start with an appropriate second order locator polynomial, and this polynomial is transformed such that of the zeros of the transformed polynomial are determinable by a parameter of word width m. This parameter is determined from the syndrome components. Following their determination, the zeros of the transformed polynomial are to be transformed into the zeros of the original locator polynomial. Using a decoder, the bit positions to be corrected can be calculated from the zeros of the original locator polynomial.

A disadvantage here is that it takes a relatively long time until the erroneous bit positions can be corrected because the parameter of the transformed locator polynomial is initially determined from the syndrome components. After the zeros of the transformed polynomial have been determined, it is still necessary to transform the zeros of the transformed polynomial into the zeros of the original locator polynomial.

A further known option for error correction using a BCH code consists of initially determining, from the syndrome components of the error syndrome, the locator polynomial whose zeros then in turn specify the bit positions to be corrected. In this case, the zeros of the locator polynomial can be determined according to Chien's algorithm. In some regards, the locator polynomial is referred to as "error-location polynomial". A disadvantage in this case is the great time outlay for determining the zeros of the locator polynomial.

SUMMARY

The present disclosure provides techniques for accelerating error correction and hence being able to carry out a faster error correction.

In some embodiments, a method is proposed for processing a bit sequence. The method determines a first partial error syndrome $s_1$ of an error syndrome and a second partial error syndrome $s_2$ of the error syndrome for the bit sequence. The method also determines a first comparison value based on a bit position and the first partial error syndrome, and determines a second comparison value based on the bit position and the second partial error syndrome. A bit value at the bit position is changed to a corrected bit value when a comparison of the first comparison value with the second comparison value assume a specified value. Otherwise the bit value is not changed and, thus, is left at the bit value. The bit position can located in the error syndrome (e.g., the first partial errror syndrome and/or the second partial error syndrome), and thus could correspond to a transformed bit sequence, which is based on the bit sequence.

Consequently, an error at the bit position may be corrected (or else not corrected) depending on a result of the comparison. In this case, it is advantageous that the two comparison values are determined locally only in relation to the current bit position and which further bit position is erroneous need not be known at this time, for example even in the case of a 2-bit error correction.

In some embodiments, an error code capable of correcting at least a 2-bit error is used for the correction.

In some embodiments, the error code is a BCH code.

In some embodiments, the bit position is corrected should the first comparison value equal the second comparison value.

In a development, the first partial error syndrome $s_1$ and the second partial error syndrome $s_2$ each have m components of the error syndrome and m>2.

In a development, the bit position is assigned a value $\beta$, the first comparison value is determined as $(s_1+\beta)^k$ and the second comparison value is determined as $s_2+\beta^k$, wherein $k \neq 0$, and $s_1$, $s_2$ and $\beta$ are elements of a Galois field.

By way of example, $s_1$, $s_2$ and $\beta$ can be elements of the Galois field GF(2m). The operation "+" then denotes addition in the Galois field and $(s_1+\beta)^k$ and $\beta^k$ denote the k-th power of $s_1+\beta$ and $\beta$, respectively, in the Galois field.

The approach described here can be used advantageously for correcting a bit position when a 2-bit error and/or a 1-bit error occur.

In some embodiments, the Galois field is $GF(2^m)$ and m>2.

In some embodiments, r bit positions $i_0, i_1, \ldots, i_{r-1}$ of the bit sequence are assigned r values $\alpha^{i_0}, \alpha^{i_1}, \alpha^{i_2}, \alpha^{i_{r-1}}$, wherein first comparison values and second comparison values are determined for bit positions to be corrected, wherein $r \geq 1$ and $\alpha$ is a generator of the Galois field.

In some embodiments, k=3 or k=−1.

In some embodiments, the method is used for error correction of a 2-bit error at bit positions i and j, wherein the first partial error syndrome is determined as $s_1=\alpha^i+\alpha^j$ and wherein the second partial error syndrome is determined as $s_2=\alpha^{k\cdot i}+\alpha^{k\cdot j}$. The comparison supplies a correction signal for correcting the i-th bit. The correction signal is determined such that it assumes a first value if $(s_1+\alpha^i)^k = s_2 \alpha^{k\cdot i}$ applies, and assumes a second value if $(s_1 \alpha^i)^k \neq s_2 \alpha^{k\cdot i}$ applies, wherein $\alpha^i$, $\alpha^j$, $\alpha^{k\cdot i}$, $\alpha^{k\cdot j}$ are elements of a Galois field $GF(2^m)$, $m \geq 3$ and k is an integer not equal to 0, and + denotes addition in the Galois field.

In some embodiments, a plurality of correction signals are determined, in each case one for a different bit, wherein the plurality of correction signals are at least partially determined with overlapping timing.

Consequently, the plurality of correction signals can be determined for example in parallel, e.g., simultaneously by parts of an item of hardware in particular. In this case, "parallel" can be understood to mean that the correction signals are not only determined in sequential fashion but are at least partially determined simultaneously. Consequently, there can be at least two correction signals which are determined simultaneously or parts which lead to these correction signals may be determined simultaneously.

In some embodiments, different correction signals are determined by means of different components.

Each of these components may comprise at least one hardware component and/or at least one software component.

In some embodiments, the first comparison value and the second comparison value are at least partially determined simultaneously.

In some embodiments, a third partial error syndrome is determined.

In some embodiments, the third partial error syndrome is a syndrome of a 3-bit error-correcting BCH code.

In some embodiments, the specified value in the correction of a 2-bit error is constant.

In some embodiments, in the correction of the 3-bit error, the specified value is determined on the basis of the respective bit position to be corrected.

In some embodiments, when the bit position to be corrected is an erroneous first bit of a 3-bit error, the specified value equals the value of the product of the second and the third bit position and the sum of the second and the third bit position, where the second bit position represents the position of the second bit error and the third bit position represents the position of the third bit error and where the product and the sum of the bit positions are determined in a Galois field $GF(2^m)$.

In some embodiments, the specified value is determined on the basis of a symmetric function of the erroneous bit positions.

In some embodiments, the symmetric function is determined using partial error syndromes of a BCH code.

In some embodiments, a parity is determined for the bit sequence.

In some embodiments, the specified value is constant if the parity of the bit sequence equals 0 and the partial error syndrome si is not equal to 0.

In some embodiments, the specified value is constant if the parity of the bit sequence equals 1 and $s_1^3 = s_2$, where si is the first partial error syndrome and $s_2$ is the second partial error syndrome.

In some embodiments, a device for processing a bit sequence is also proposed, said device being configured to: determine a first partial error syndrome si of an error syndrome and a second partial error syndrome $s_2$ of the error syndrome for the bit sequence, determine a first comparison value on the basis of a bit position and the first partial error syndrome, determine a second comparison value on the basis of the bit position and the second partial error syndrome, correct the bit position should a comparison between the first comparison value and the second comparison value assume a specified value, not correct the bit position should the comparison between the first comparison value and the second comparison value not assume the specified value.

In some embodiments, the device comprises a plurality of components, more particularly processing units and/or circuits, on the basis of which the correction or the non-correction of bit positions is at least in part implementable in simultaneous fashion.

In some embodiments, the device is part of a memory or a memory system or is embodied separately from the memory or the memory system.

The device may be part of the memory or embodied separately from the latter. In particular, the device may comprise a processing unit which carries out the steps mentioned here. The processing unit may comprise at least one of the following components: a processor, a microcontroller, a circuit, an ASIC, an FPGA, a logic unit.

The processing unit can be realized in the form of at least one physical unit. In particular, the processing unit may be distributed among a plurality of physical units.

The explanations given above in relation to the methods apply accordingly to the device. The steps described here of the method may be carried out by means of the device.

The above-described properties, features and advantages of this invention and the manner in which they are achieved will be described below in conjunction with a schematic description of exemplary embodiments, which are explained in more detail in conjunction with the drawings. In this case, the same elements or elements with the same effect may be provided with identical reference signs for a better overview.

DETAILED DESCRIPTION

Figure 1:
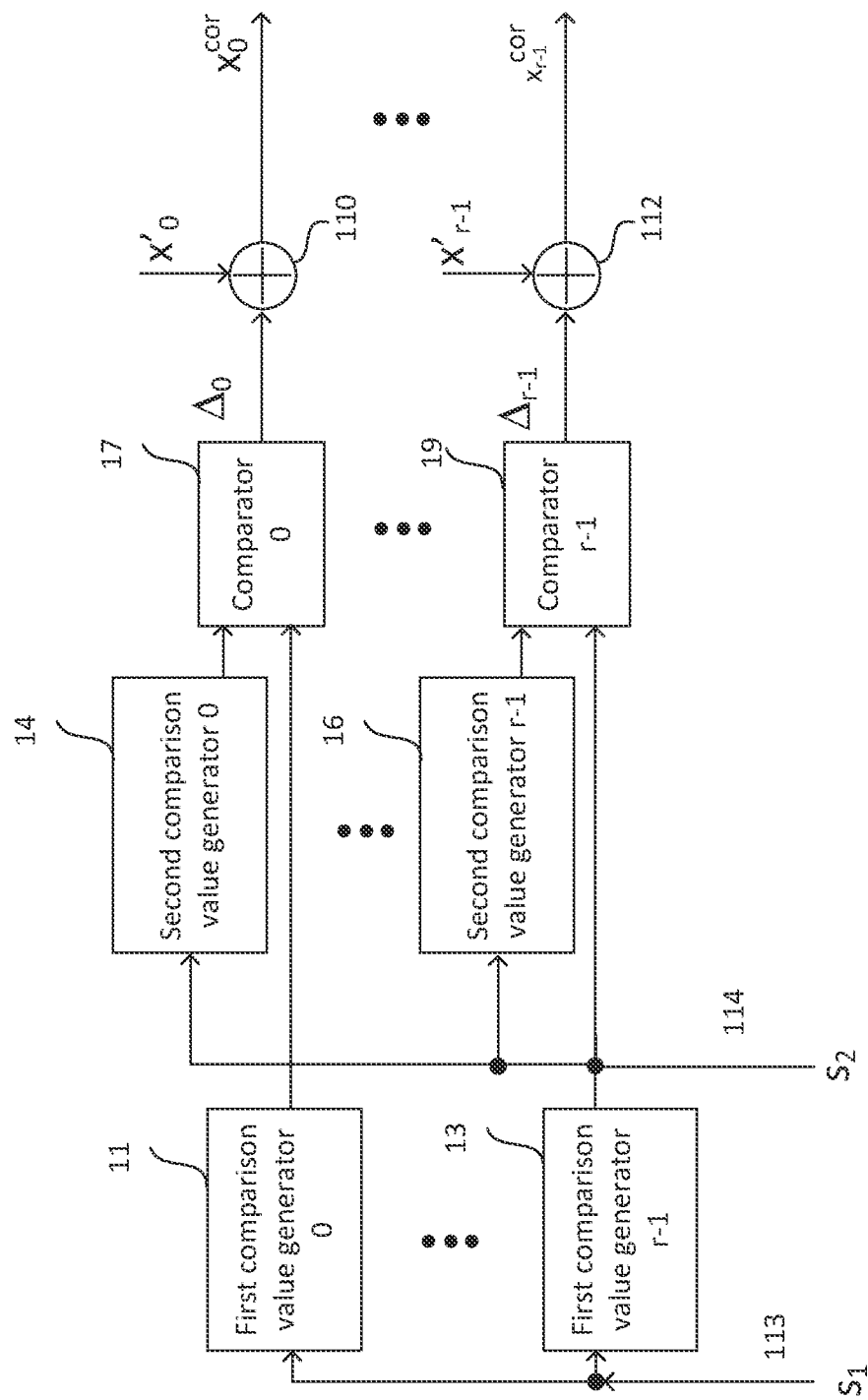
FIG. 1 shows an exemplary symbolic block diagram for a possible correction of a multiplicity of bit positions.

By way of example, the determination of a correction value for a bit to be corrected is proposed. By way of example, the bit is part of a bit sequence. The correction value can be determined using an error code.

Error syndromes, in particular partial error syndromes, can be determined for the error code. By way of example, a first partial error syndrome and a second partial error syndrome may be determined. A first comparison value is ascertained on the basis of the first partial error syndrome and a bit position to be corrected, and a second comparison value is ascertained on the basis of the second partial error syndrome and the bit position to be corrected. If the two comparison values are identical, the correction value can be set equal to a first value (e.g., "1"). If the two comparison values are not equal, the correction value can be set equal to a second value (e.g., "0").

In this context, the first comparison value and the second comparison value, and hence also the correction value for the bit position, in each case are determined advantageously directly from one of the partial error syndromes and the bit position, without it being necessary to ascertain a locator polynomial and the zeros thereof by way of a search method, for example.

If use is made of a Galois field $GF(2^m)$ with m>2, each bit position to be corrected may be reversibly assigned an m-component value. On the basis of this value and the first syndrome component, it is possible to determine the first comparison value. Accordingly, the second comparison value can be determined using this value and the second syndrome component.

In one option, correction values for a plurality of bit positions, in particular for all bit positions, are determined according to this scheme. Preferably, correction values for at least two bit positions can be determined in parallel. In this case, "determined in parallel" means that the correction values are determined at least partly simultaneously (that is to say at least partly with overlapping timing), preferably using different hardware and/or software.

Various bit positions to be corrected
$i_0, i_1, \ldots, i_r$
can be reversibly uniquely assigned various values
$\beta_{i_0}, \ldots, \beta_{i_r}$
in pairs. The bit positions can be denoted by
$0, 1, \ldots, r$
and the values can be denoted by
$\beta_0, \ldots, \beta_r$
in simplified notation.

The first comparison value for the bit position $i_j$ to be corrected, with $j=0, \ldots, r$ can be determined as
$(s_1 \beta_{i_j})^k$
and the second comparison value for the bit position to be corrected can be determined as
$s_2 \beta_{ij}^k$,
where $s_1$ denotes the first partial error syndrome, $s_2$ denotes the second partial error syndrome and k denotes a specified value.

Here, k is not equal to 0; $s_1$, $s_2$ and $\beta$ may be determined as values of a Galois field. If the Galois field is $GF(2^m)$ with $m>2$, $s_1$, $s_2$ and $\beta$ can be described as m-component binary vectors in their vector representation. Then, formation of exponentials is likewise determined in the corresponding Galois field.

In one option, all bit positions to be corrected
$i_0, i_1, i_2, \ldots i_{n-1}$
are assigned pairwise different values
$\beta_{i_0}, \beta_{i_1}, \beta_{i_2}, \ldots, \beta_{i_{n-1}}$
of the Galois field. If a is a generator or primitive element of the Galois field, $$\beta_{i_0} = \alpha^{j_0},$$
$$\beta_{i_1} = \alpha^{j_1},$$
$$\beta_{i_2} = \alpha^{j_2},$$
$$\vdots$$
$$\beta_{i_{n-1}} = \alpha^{j_{n-1}}$$

is defined in one option.

A correction value $\Delta_r$ for the r-th bit can be determined as 1 if
$(s_1 + \alpha^{i_r})^k = s_2 + \alpha^{k \cdot i_r}$ applies and a correction value $\Delta_r$ can be determined as 0 if $$(s_1 + \alpha^{i_r})^k \neq s_2 + \alpha^{k \cdot i_r} \quad (2)$$

applies.

An advantageous variant consists of the term $s_1 + \alpha^{i_r}$ being realized by virtue of the components of si in which air equals 1 being inverted and the components of $s_1$ in which $\alpha^{i_r}$ equals 0 remaining unchanged.

The addition of $s_1$ and $\alpha^{i_r}$ in the Galois field $GF(2^m)$, which corresponds to a component-by-component XOR operation on $s_1$ and $\alpha^{i_r}$ in their vector representation, can be realized by means of inverters which invert the components of $s_1$ in which air equals 1 and the components of $s_1$ in which $\alpha^{i_r}$ equals 0 remain unchanged. Thus, to implement $s_1 + \alpha^{i_r}$ in this example, only inverters and no XOR gates are required.

Accordingly, the term $s_2 + \alpha^{k \cdot i_r}$ can be realized by virtue of the components of $s_2$ in which $\alpha^{k \cdot i_r}$ equals 1 being inverted and the components of $s_2$ in which $\alpha^{k \cdot i_r}$ equals 0 remaining unchanged.

A bit error-correcting code which can correct at least two bit errors can be used as an error code. By way of example, an appropriate BCH code may be used. An option consists of incorporating a parity (that is to say at least one parity bit) into the error detection.

An H-matrix $$H = \begin{pmatrix} H_1 \\ H_2 \end{pmatrix} = \begin{pmatrix} \alpha^{j_0} & \alpha^{j_1} & \alpha^{j_2} & \alpha^{j_3} & \ldots & \alpha^{j_{n-1}} \\ \alpha^{3j_0} & \alpha^{3j_1} & \alpha^{3j_2} & \alpha^{3j_3} & \ldots & \alpha^{3j_{n-1}} \end{pmatrix} \quad (3)$$

may be used to describe a 2-bit error-correcting BCH code. The values $\alpha^j$ are elements of the Galois field $GF(2^m)$ in their vector representation as m-component binary vectors, wherein the exponents should be interpreted modulo $2^m-1$. Furthermore, $n \leq 2^m - 1$ applies.

A 2-bit error-correcting and 3-bit error-detecting BCH code with included parity may be described by an H-matrix $$H = \begin{pmatrix} H_1 \\ H_2 \\ P \end{pmatrix} = \begin{pmatrix} \alpha^0 & \alpha^1 & \alpha^2 & \alpha^3 & \ldots & \alpha^{n-1} \\ \alpha^0 & \alpha^3 & \alpha^6 & \alpha^9 & \ldots & \alpha^{3 \cdot (n-1)} \\ 1 & 1 & 1 & 1 & \ldots & 1 \end{pmatrix} \quad (4)$$

for example. In this case, the following applies:

$$i_0 = 0,$$
$$i_1 = 1,$$
$$i_2 = 2,$$
$$\vdots$$
$$i_r = r,$$
$$\vdots$$
$$i_{n-1} = n - 1.$$

If
$$x' = x'_0, \ldots, x'_{n-1}$$
is a binary vector to be corrected (that is to say a bit sequence which might be erroneous), then the error syndrome s is determined as follows:

$$s = H \cdot x' \quad (5)$$

For an H matrix with $$H = \begin{pmatrix} H_1 \\ H_2 \end{pmatrix}$$

the first partial error syndrome s1 may be determined as $$s_1 = H_1 \cdot x' \quad (6)$$

and the second partial error syndrome s2 may be determined as $$s_2 = H_2 \cdot x' \quad (7)$$

with the matrix $H_2$ also being referred to as matrix $H_3$ and the partial error syndrome $s_2$ also being referred to as partial error syndrome $s_3$ in the case of a binary BCH code.

In the case of a 2-bit error, the partial error syndromes $s_1$ and $s_2$ of the error syndrome are determined as:

$$s_1 = \alpha^i + \alpha^j \quad (8)$$

$$s_2 = \alpha^{3 \cdot i} + \alpha^{3 \cdot j} \quad (9)$$

For the partial error syndrome $$s_P = [1, \ldots, 1] \cdot x'$$

the following applies in the case of a 2-bit error:

$$s_P = 1 + 1 = 0$$

For the i-th bit, the correction value $\Delta_i$ for a 2-bit error is as follows:

$$\Delta_i = \begin{cases} 1 \text{ for } (s_1 + \alpha^i)^3 = s_2 + \alpha^{3 \cdot i} \\ 0 \text{ for } (s_1 + \alpha^i)^3 \neq s_2 + \alpha^{3 \cdot i} \end{cases} \quad (10)$$

If a 2-bit error is present in bit positions i and j, then taking account of equations (8) and (9) above $$s_1 + \alpha^i + \alpha^i + \alpha^j + \alpha^i = \alpha^j$$

$$s_2 + \alpha^{3i} = \alpha^{3i} + \alpha^{3j} + \alpha^{3i} = \alpha^{3j}$$

and hence $$(s_1 + \alpha^i)^3 = \alpha^{3j} = s_2 + \alpha^{3i}$$

with the correction value $\Delta_i = 1$.

For $r \neq i, j$, once again taking account of equations (8) and (9), the following applies:

$$s_1 + \alpha^r = \alpha^i + \alpha^j + \alpha^r$$

$$s_2 + \alpha^{3r} = \alpha^{3i} + \alpha^{3j} + \alpha^{3r}$$

and hence $$(s_1 + \alpha^r)^3 \neq s_2 + \alpha^{3r}$$

with the correction value $\Delta_i = 0$.

The bit positions $i_0 = 0,$ $i_1 = 1,$ $i_2 = 2,$ $\vdots$ $i_{n-1} = n - 1$ are reversibly uniquely assigned the elements $\alpha^0, \alpha^1, \alpha^2, \alpha^{n-1}$ of the Galois field $GF(2^m)$ in their vector representation as m-component binary vectors, for example.

For the bit position i to be corrected,
a first comparison value
$(s_1 + \alpha^i)^3$
is determined on the basis of the first partial error syndrome $S_i$ and the bit position i and
a second comparison value
$s_2[\alpha^i]^3 = s_2 + \alpha^{3i}$
is determined on the basis of the second partial error syndrome $s_2$ and the bit position i.

If the first and second comparison values correspond, $\Delta_i = 1$ arises as correction value and the i-th bit position is corrected. If the two comparison values do not correspond, $\Delta_i = 0$ arises as correction value and there is no correction at the i-th bit position.

For a 1-bit error at the error position j, the following applies:

$$s_1 = \alpha^j$$

$$s_2 = \alpha^{3j}$$

Hence, the first comparison value is determined as $$(s_1 + \alpha^i)^3 = (\alpha^j + \alpha^i)^3$$

and the second comparison value is determined as $$(s_1 + \alpha^{3 \cdot i}) = \alpha^{3j} + \alpha^{3 \cdot i}$$

for for a bit position i to be corrected. If the error position j and the bit position i to be corrected correspond (that is to say i=j), then the following applies:

$$(s_1 + \alpha^i)^3 = (\alpha^i + \alpha^i)^3 = 0^3 = 0 = s_2 + \alpha^{3 \cdot i} = \alpha^{3 \cdot i} + \alpha^{3 \cdot i} = 0.$$

The first comparison value and the second comparison value are the same even in the case of the 1-bit error in position i and there is a correction of the bit position i.

If the error position j and the bit position i to be corrected do not correspond (that is to say i≠j), then the following applies:

$$(s_1 + \alpha^i)^3 = (\alpha^j + \alpha^i)^3 \neq s_2 + \alpha^{3 \cdot i} + \alpha^{3 \cdot i}$$

In this case, the first comparison value and the second comparison value are not the same, and so there is no correction at the bit position i since the error is present at another bit position j.

A comparison of the first comparison value and of the second comparison value, which are each determined as m-component binary vectors, can be implemented for example by a component-by-component exclusive or operation (XOR operation) and a subsequent or operation (OR operation).

EXAMPLE: H-MATRIX WITH PARITY

A further example of an H-matrix of a code for 2-bit error correction and 3-bit error detection is as follows:

$$H = \begin{pmatrix} H_1 \\ H_{-1} \\ P \end{pmatrix} = \begin{pmatrix} \alpha^0 & \alpha^1 & \alpha^2 & \alpha^3 & \ldots & \alpha^{n-1} \\ \alpha^0 & \alpha^{-1} & \alpha^{-2} & \alpha^{-3} & \ldots & \alpha^{-(n-1)} \\ 1 & 1 & 1 & 1 & \ldots & 1 \end{pmatrix}. \quad (11)$$

The partial error syndromes $s_1$ and $s_2$ of the error syndrome arise as follows for the 2-bit error:

$$s_1 = \alpha^i + \alpha^j \quad (12)$$

$$s_2 = \alpha^{-i} + \alpha^{-j} \quad (13)$$

The values $\alpha^j$ again are elements of the Galois field $GF(2^m)$ in their vector representation as m-component binary vectors, wherein the exponents should be interpreted modulo $2^m - 1$. Furthermore, $n \leq 2^m - 1$ applies.

For the i-th bit, the correction value $\Delta_i$ for the 2-bit error is determined as follows:

$$\Delta_i = \begin{cases} 1 \text{ for } (s_1 + \alpha^i)^{-1} = s_2 + \alpha^{-1} \\ 0 \text{ for } (s_1 + \alpha^i)^{-1} \neq s_2 + \alpha^{-1} \end{cases} \quad (14)$$

The first comparison value for the bit position i is $$(s_1+\alpha^i)^{-1}$$

and the second comparison value for this bit position is $$s_2+\alpha^{-i}$$

Further Exemplary Embodiments

FIG. 1 shows an exemplary diagram for r bit positions 0 to r−1 to be corrected.

An m-bit wide partial error syndrome $S_i$ is applied to an m-bit wide input 113, which is connected to the inputs of r first comparison value generators 11 to 13. The comparison value generators 11 to 13 are suited to determining a first comparison value per bit position on the basis of the partial error syndrome $s_1$ and on the basis of the bit position.

An m-bit wide partial error syndrome $s_2$ is applied to an m-bit wide input 114, which is connected to the inputs of r second comparison value generators 14 to 16. The comparison value generators 14 to 16 are suited to determining a second comparison value per bit position on the basis of the partial error syndrome $s_2$ and on the basis of the bit position.

Now, a comparison of the first comparison value with the second comparison value is carried out for each bit position by means of a comparator. To this end, r comparators 17 to 19 are provided, the inputs of which are connected to the appropriate outputs of the comparison value generators.

A respective correction value $\Delta_0$ to $\Delta_{r-1}$ for the respective bit position is provided at the output of the comparator 17 to 19. By way of example, the correction value is 1 if the comparison value generators connected to the comparator supply the same output signals and the correction value is 0 if the comparison value generators supply unequal output signals.

The output of the respective comparator 17 to 19 is connected to the input of an XOR gate 110 to 112. A possibly erroneous bit $x_0^1$ to $x_{r-1}^1$ is applied to the other input of the respective XOR gate 110 to 112. A corrected bit $$x_0^{cor} = x_0' + \Delta_0,$$
$$\vdots$$
$$x_{r-1}^{cor} = x_{r-1}' + \Delta_{r-1}$$

is provided at the output of the XOR gate 110 to 112. Here, + denotes addition modulo 2.

In this case, a bit is referred to as corrected bit if a correction value has been added to a possibly erroneous bit. Here, the correction value can equal 1 if the bit was erroneous and the correction value can equal 0 if the bit was not erroneous. Independently of whether or not the bit was erroneous, the resultant bit following the addition of the correction value is referred to as corrected bit in this case. The addition is implemented modulo 2 and can be realized by an XOR operation.

As already explained above, the determination of the corrected bit is implemented for all bit positions. By way of example, the following applies to the bit position 0: The output of the comparison value generator 11 is connected to the first input of the comparator 17 and the output of the comparison value generator 14 is connected to the second input of the comparator 17. The output of the comparator 17 supplies the correction value $\Delta_0$ to the first input of the XOR gate 110, at the second input of which the possibly erroneous bit $x'_0$ is applied. At its output, the XOR gate 110 consequently supplies the corrected bit $x_0^{corr}$. This is implemented accordingly for the further bit positions 1 to r−1.

Figure 2:
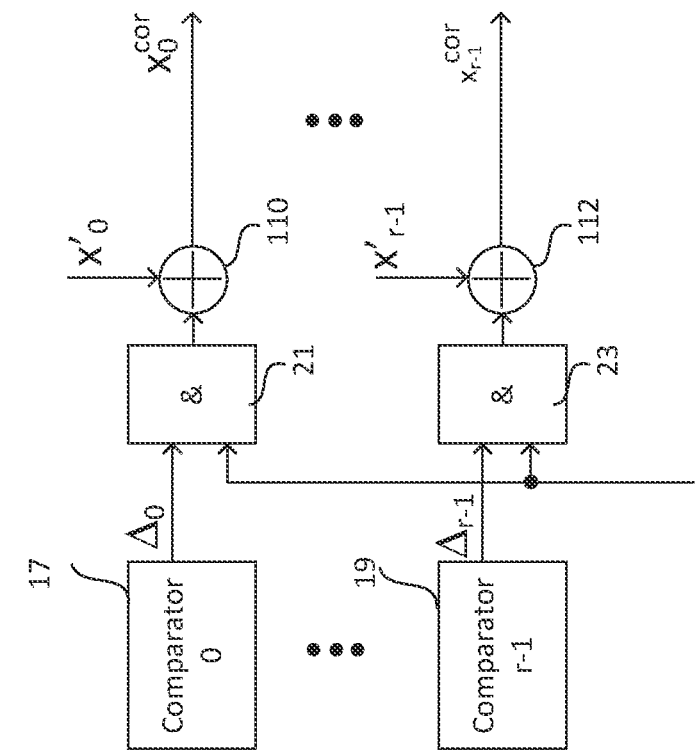
FIG. 2 shows a block diagram based on FIG. 1, additionally with a bit error coding signal, on the basis of which the correction can be switched inactive.

FIG. 2 shows an exemplary arrangement on the basis of the representation shown in FIG. 1. An AND gate 21 to 23 is arranged between the output of the respective comparator 17 to 19. The first input of the AND gate 21 to 23 is connected to the output of the comparator 17 to 19 and the second input of the AND gate 21 to 23 is connected to an image error coding signal 201. The output of the AND gate 21 to 23 is connected to the XOR gate 110 to 112.

The arrangement shown in FIG. 2 once again applies per bit position. By way of example, for the bit position 0, the output of the comparator 17 is connected to the first input of the AND gate 21. The second input of the AND gate is connected to the bit error coding signal 201 The output of the AND gate 21 is connected to the first input of the XOR gate 110. These explanations apply accordingly to the further bit positions 1 to r−1, with the bit error coding signal 201 being applied to all second inputs of the AND gates 21 to 23.

The bit error coding signal 201 is for example a binary value 1 if a 1-bit error or a 2-bit error was determined on account of the error syndrome, and a binary value 0 if the error syndrome equals 0, and hence no errors are indicated by the error syndrome. Consequently, what follows from the link to the respective AND gate 21 to 23 is that no change of the value of the bit $x'_0$ to $x'_{r-1}$ applied to the XOR gate 110 to 112 is implemented, that is to say no correction is carried out.

Figure 3:
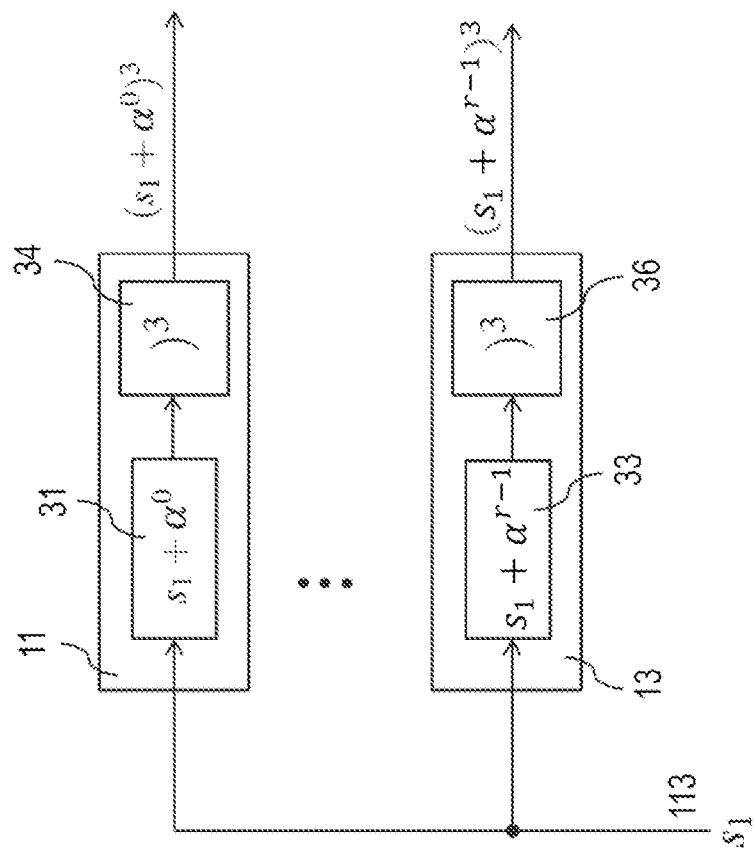
FIG. 3 shows a first alternative for realizing the comparison value generator, shown in FIG. 1, for processing the partial error syndrome $s_1$.

FIG. 3 shows an exemplary configuration of the comparison value generators 11 to 13 of FIG. 1.

By way of example, a 2-bit error-correcting BCH code with an H-matrix as per equation (4) is used. The possibly to be corrected bit positions are the bit positions 0 to r−1.

Each comparison value generator 11 to 13 comprises a series connection of an adding member 31 to 33 and a third power generator 34 to 36.

The structure of the comparison value generator 11 for the bit position 0 can be described as follows: The comparison value generator 11 comprises the series connection of the adding member 31 and the third power generator 34. The adding member 31 facilitates a component-by-component XOR operation on the first partial error syndrome $s_1$ and $\alpha^0$ in its vector representation. It is an option to realize the XOR operation on the partial error syndrome $s_1$ and $\alpha^0$ by virtue of inverting those components of $s_1$ where $\alpha^0$ equals 1 and leaving the components of $s_1$ in which $\alpha^0$ equals 0 unchanged. In a Galois field $GF(2^m)$ $$\alpha^0 = \underbrace{(0...01)}_{m},$$

and so the first component of $s_1$ is inverted while all other components of $s_1$ remain unchanged.

The third power generator 34 is provided to form and output, in the Galois field $GF(2^m)$, the third power $(s_1+\alpha^0)^3$ of the value $(s_1+\alpha^0)$ applied to its input. The third power generator 34 can be realized as a combinational circuit.

This is implemented accordingly for the further bit positions 1 to r−1, wherein the respective adding member correspondingly carries out an addition with $\alpha^1$ to $\alpha^{r-1}$.

Figure 4:
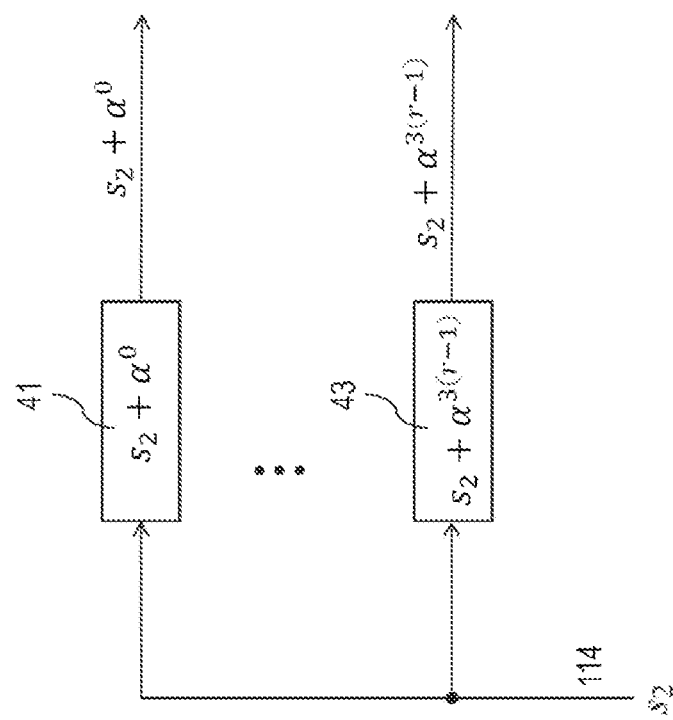
FIG. 4 shows a first alternative for realizing the comparison value generator, shown in FIG. 1, for processing the partial error syndrome $s_2$.

FIG. 4 shows an exemplary configuration of the comparison value generators 14 to 16 of FIG. 1.

Each comparison value generator 14 to 16 comprises an adding member 41 to 43.

The structure of the comparison value generator 14 for the bit position 0 can be described as follows: The comparison value generator 14 comprises the adding member 41 in order to XOR-link, component-by-component, the partial error syndrome $s_2$ and $\alpha^0$ functionally in its vector representation. It is an option to realize the XOR operation on the partial error syndrome $s_2$ and $\alpha^0$ by virtue of inverting those components of $s_2$ where $\alpha^0$ equals 1 and leaving the components of $s_2$ where $\alpha^0$ equals 0 unchanged.

This is implemented accordingly for the further bit positions j (with j=1, . . . , r−1), wherein the respective adding member accordingly carries out an addition with $\alpha^{3j}$.

The Third Power Generator

A third power generator in a Galois field $GF(2^m)$ can be realized as a combinational circuit with m binary inputs and m binary outputs. It is one option to describe the combinational functionality by a value table and to realize the value table as a circuit using a synthesis tool.

For i=0, . . . , $2^m$−1, the input value $\alpha^i$ in its vector representation as a m-component binary vector is assigned the corresponding output value $\alpha^{3 \cdot i}$ in such a value table. The input value $$\underbrace{(0...0)}_{m}$$

can be assigned the output value $$\underbrace{(0...0)}_{m}.$$

The exponents should be interpreted modulo $2^m-1$ and $\alpha$ is a generator of the Galois field.

For elucidating purposes, a Galois field $GF(2^3)$ with the modular polynomial $$M(x)=x^3+x+1$$

is considered, for which the elements $\alpha^0$ to $\alpha^6$ are represented in their vector representation in the following table "Exponential representation and vector representation", wherein the element 0 is shown as 000:

| Exponential representation | Vector representation |
|---|---|
| 0 | 000 |
| $\alpha^0$ | 001 |
| $\alpha^1$ | 010 |
| $\alpha^2$ | 100 |
| $\alpha^3$ | 011 |
| $\alpha^4$ | 110 |
| $\alpha^5$ | 111 |
| $\alpha^6$ | 101 |

Value tables for Galois fields up to $GF(2^{10})$ are shown in [Lin, S.; Costello, D.: Error Control Coding, Prentice Hall, 1983, pages 561 to 577] for example.

The third power generator outputs $\alpha^{3 \cdot i}$ on the basis of an input of $\alpha^i$, wherein the exponents should be interpreted modulo $2^3-1=7$ in this case. That is to say, the following relationships arise between input and output:

| Input | Output |
|---|---|
| $\alpha^0$ | $\alpha^0$ |
| $\alpha^1$ | $\alpha^3$ |
| $\alpha^2$ | $\alpha^6$ |
| $\alpha^3$ | $\alpha^2$ |
| $\alpha^4$ | $\alpha^5$ |
| $\alpha^5$ | $\alpha^1$ |
| $\alpha^6$ | $\alpha^4$ |

A corresponding binary value table on the basis of the vector representations of the values $\alpha^i$ shown above is elucidated by the following table of the third power generator in $GF(2^3)$:

| Input value | Output value |
|---|---|
| 000 | 000 |
| 001 | 001 |
| 010 | 011 |
| 011 | 100 |
| 100 | 101 |
| 101 | 110 |
| 110 | 111 |
| 111 | 010 |

Example: Comparison Value Generator with Galois Field Inverter

Figure 5:
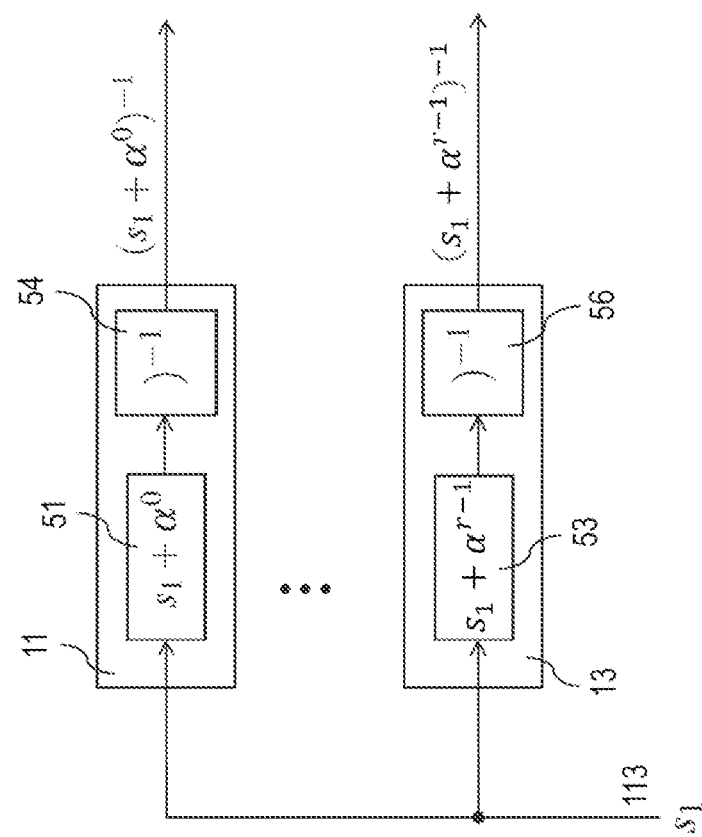
FIG. 5 shows a second alternative for realizing the comparison value generator, shown in FIG. 1, for processing the partial error syndrome $s_1$.

FIG. 5 shows an exemplary alternative configuration of the comparison value generators 11 to 13 of FIG. 1.

A 2-bit error-correcting code with an H-matrix as per equation (11) is used in exemplary fashion. The bit positions possibly to be corrected are the bit positions 0 to r−1.

Each comparison value generator 11 to 13 comprises a series connection of an adding member 51 to 53 and a Galois field inverter 54 to 56.

The structure of the comparison value generator 11 for the bit position 0 can be described as follows: The comparison value generator 11 comprises the series connection of the adding member 51 and the Galois field inverter 54. The adding member 51 facilitates a component-by-component XOR operation on the first partial error syndrome $s_1$ and $\alpha^0$ in its vector representation. The Galois field inverter 54 is provided to form and output, in the Galois field $GF(2^m)$, $(s_1+\alpha^0)^{-1}$ on the basis of the value $(s_1+\alpha^0)$ applied to its input. The Galois field inverter 54 can be realized as a combinational circuit.

This is implemented accordingly for the further bit positions 1 to r−1, wherein the respective adding member correspondingly carries out an addition with $\alpha^1$ to $\alpha^{r-1}$.

Figure 6:
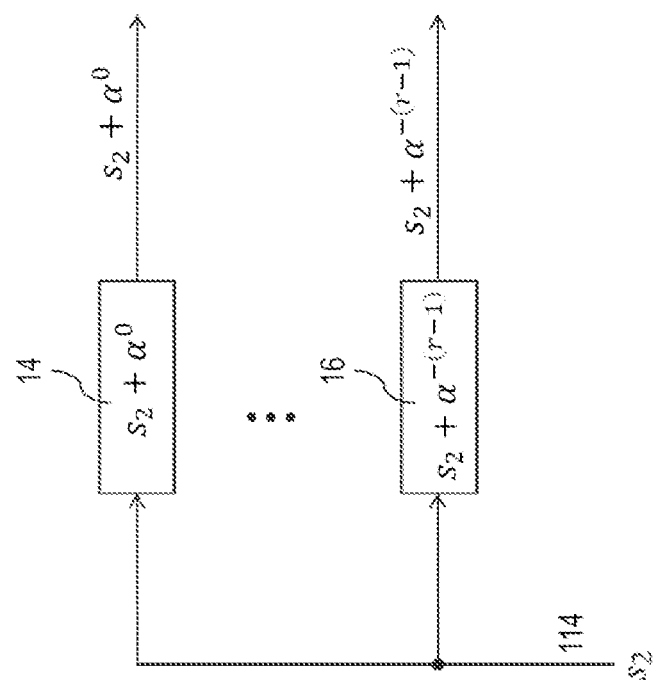
FIG. 6 shows a second alternative for realizing the comparison value generator, shown in FIG. 1, for processing the partial error syndrome $s_2$.

FIG. 6 shows an exemplary configuration of the comparison value generators 14 to 16 of FIG. 1.

Each comparison value generator 14 to 16 comprises an adding member 61 to 63.

The structure of the comparison value generator 14 for the bit position 0 can be described as follows: The comparison value generator 14 comprises the adding member 61 in order to XOR-link, component-by-component, the partial error syndrome $s_2$ and $\alpha^0$ functionally in its vector representation.

This is implemented accordingly for the further bit positions j (with j=1, . . . , r−1), wherein the respective adding member correspondingly carries out an addition with $\alpha^j$.

The Galois field inverter in a Galois field $GF(2^m)$ can be realized as a combinational circuit with m binary inputs and m binary outputs. It is one option to describe the combinational functionality thereof by a value table and to realize the value table as a circuit using a synthesis tool.

For i=0, . . . ,$2^m-1$, the input value $\alpha^i$ in its vector representation as a m-component binary vector is assigned the corresponding output value $\alpha^{-i}$ in such a value table. The input value $$\underbrace{(0\ldots0)}_{m}$$

can be assigned the output value $$\underbrace{(0\ldots0)}_{m}$$

The exponents should be interpreted modulo $2^m-1$ and $\alpha$ is a generator of the Galois field. Furthermore, $\alpha^0=\alpha^{-0}$ applies.

For elucidating purposes, the Galois field $GF(2^3)$ with the modular polynomial $$M(x)=x^3+x+1$$

is considered, for which the elements $\alpha^0$ to $\alpha^6$ are represented in the table labeled "Exponential representation and vector representation" above.

The Galois field inverter outputs $\alpha^0$ when $\alpha^0$ is input, and outputs $\alpha^{7-i}$ when $\alpha^i$ is input, wherein the exponents should be interpreted modulo $2^3-1=7$ in this case. That is to say, the following applies:

| Input | Output |
|---|---|
| $\alpha^0$ | $\alpha^0$ |
| $\alpha^1$ | $\alpha^6$ |
| $\alpha^2$ | $\alpha^5$ |
| $\alpha^3$ | $\alpha^4$ |
| $\alpha^4$ | $\alpha^3$ |
| $\alpha^5$ | $\alpha^2$ |
| $\alpha^6$ | $\alpha^1$ |

A corresponding binary value table on the basis of the vector representations of the values $\alpha^i$ shown above is elucidated by the following table of the Galois field inverter in $GF(2^3)$:

| Input value | Output value |
|---|---|
| 000 | 000 |
| 001 | 001 |
| 010 | 101 |
| 011 | 110 |
| 100 | 111 |
| 101 | 010 |
| 110 | 011 |
| 111 | 100 |

Fast correction of 3-bit errors

A fast correction of 3-bit errors is presented below in exemplary fashion. To this end, a 3-bit error-correcting BCH code may be used.

A 3-bit error-correcting BCH code may be described by an H-matrix $$H = \begin{pmatrix} H_1 \\ H_2 \\ H_3 \end{pmatrix} = \begin{pmatrix} \alpha^{i_0} & \alpha^{i_1} & \alpha^{i_2} & \alpha^{i_3} & \ldots & \alpha^{i_{n-1}} \\ \alpha^{3i_0} & \alpha^{3i_1} & \alpha^{3i_2} & \alpha^{3i_3} & \ldots & \alpha^{3i_{n-1}} \\ \alpha^{5i_0} & \alpha^{5i_1} & \alpha^{5i_2} & \alpha^{5i_3} & \ldots & \alpha^{5i_{n-1}} \end{pmatrix} \quad (15)$$

By way of example, the values a' are elements of the Galois field $GF(2^m)$ in their vector representation as m-component binary vectors, wherein the exponents should be interpreted modulo $(2^m-1)$. The following apply: $n \leq 2^m-1$ and m>2.

Additionally, a 3-bit error-correcting BCH code may be described by an H-matrix:

$$H = \begin{pmatrix} H_1 \\ H_2 \\ H_3 \end{pmatrix} = \begin{pmatrix} \alpha^0 & \alpha^1 & \alpha^2 & \alpha^3 & \ldots & \alpha^{n-1} \\ \alpha^0 & \alpha^3 & \alpha^6 & \alpha^9 & \ldots & \alpha^{3\cdot(n-1)} \\ \alpha^0 & \alpha^5 & \alpha^{10} & \alpha^{15} & \ldots & \alpha^{5\cdot(n-1)} \end{pmatrix} \quad (16)$$

In this case, the following apply:

$i_0 = 0,$ $i_1 = 1,$ $i_2 = 2,$ $\ldots$ $i_r = r,$ $\vdots$ $i_{n-1} = n - 1$

If $$x' = x'_0, \ldots, x'_{n-1}$$

is a binary vector to be corrected, then the error syndrome s is determined as $$s = H \cdot x' \quad (17)$$

For the H-matrix with $$H = \begin{pmatrix} H_1 \\ H_2 \\ H_3 \end{pmatrix}$$

the first partial error syndrome $s_1$ can be determined as $$s_1 = H_1 \cdot x' \quad (18)$$

the second partial error syndrome $s_2$ can be determined as $$s_2 = H_2 \cdot x' \quad (19)$$

and the third partial error syndrome $s_3$ can be determined as $$s_x = H_3 \cdot x' \quad (20)$$

In the case of a binary BCH code, the matrix $H_2$ can be referred to as matrix $H_3$, the partial error syndrome $s_2$ can be referred to as partial error syndrome $s_3$, the matrix $H_3$ can be referred to as matrix $H_5$ and the partial error syndrome $s_3$ can be referred to as partial error syndrome $s_5$.

While two partial error syndromes, for example the partial error syndromes $s_1$ and $s_2$, are used for the correction of a 2-bit error, the partial error syndrome $s_3$ is additionally used to correct a 3-bit error.

One option is to use the parity of bits for error detection and/or error correction. A 3-bit error-correcting BCH code with parity can be described by an H-matrix.

$$H = \begin{pmatrix} H_1 \\ H_2 \\ H_3 \\ H_P \end{pmatrix} = \begin{pmatrix} \alpha^{i_0} & \alpha^{i_1} & \alpha^{i_2} & \alpha^{i_3} & \ldots & \alpha^{i_{n-1}} \\ \alpha^{3i_0} & \alpha^{3i_1} & \alpha^{3i_2} & \alpha^{3i_3} & \ldots & \alpha^{3i_{n-1}} \\ \alpha^{5i_0} & \alpha^{5i_1} & \alpha^{5i_2} & \alpha^{5i_3} & \ldots & \alpha^{5i_{n-1}} \\ 1 & 1 & 1 & 1 & \ldots & 1 \end{pmatrix} \quad (21)$$

where $H_P$ denotes a parity matrix. Alternatively, a 3-bit error-correcting BCH code with parity may also be described by the H-matrix $$H = \begin{pmatrix} H_1 \\ H_2 \\ H_3 \\ H_P \end{pmatrix} = \begin{pmatrix} \alpha^0 & \alpha^1 & \alpha^2 & \alpha^3 & \ldots & \alpha^{n-1} \\ \alpha^0 & \alpha^3 & \alpha^6 & \alpha^9 & \ldots & \alpha^{3 \cdot (n-1)} \\ \alpha^0 & \alpha^5 & \alpha^{10} & \alpha^{15} & \ldots & \alpha^{5 \cdot (n-1)} \\ 1 & 1 & 1 & 1 & \ldots & 1 \end{pmatrix} \quad (22)$$

In this respect, reference is made to equations (15) and (16) above, which were augmented by the matrix $H_P$.

With the binary vector x' to be corrected, the error syndrome s arises as $$s = H \cdot x' \quad (23)$$

With $$H = \begin{pmatrix} H_1 \\ H_2 \\ H_3 \\ H_P \end{pmatrix}$$

the following follows for the partial error syndromes s1, s2, s3 and s4:

$$s_1 = H_1 \cdot x'$$

$$s_2 = H_2 \cdot x'$$

$$s_3 = H_3 \cdot x'$$

$$s_4 = s_P = H_P \cdot x' = x_0 + x_1 + \ldots + x_{n-1}.$$

In this case, "+" denotes addition modulo 2, corresponding to an XOR operation. The partial error syndrome $s_P$ is the parity of the bits $x_0$ to $x_{n-1}$.

The partial error syndromes $s_1$, $s_2$ and $s_3$ of the error syndrome arise for the 3-bit error in bit positions i, j and k as $$s_1 = \alpha^i + \alpha^j + \alpha^k \quad (24)$$

$$s_2 = \alpha^{3i} \alpha^{3j} \alpha^{3k} \quad (25)$$

$$s_3 = \alpha^{5i} + \alpha^{5j} + \alpha^{5k} \quad (26)$$

The bit positions i, j and k may also be described, for example, by the values $a^i$, $a^j$, $a^k$, by elements of the Galois field $GF(2^m)$, by the binary values $x'_i$, $x'_j$, $x'_k$ to be corrected or by i, j and k.

For a 3-bit error in bit positions i, j and k, the following applies:

$$(s_1 + \alpha^i)^3 = s_2 + \alpha^{3i} + \alpha^j \cdot \alpha^k)(\alpha^j + \alpha^k) \quad (27)$$

This emerges by recalculation. In this case, $\alpha^j \cdot \alpha^k$ is the product of the elements $\alpha^j$ and $\alpha^k$ in the Galois field $GF(2^m)$ and $\alpha^j + \alpha^k$ denotes their sum in the Galois field, which may be determined for example in the vector representation of $\alpha^j$ and $\alpha^k$ as m-component of binary vectors by the component-by-component XOR operation on these binary vectors.

In the case of a 3-bit error in bit positions $a^i$, $\alpha^j$ and $\alpha^k$, the partial error syndromes $s_1$ and $s_2$ are determined by equations (24) and (25).

With $$s_1 + \alpha^i = \alpha^j + \alpha^k \quad (28)$$

$$s_2 + \alpha^{3i} = \alpha^{3j} + \alpha^{3k} \quad (29)$$

it is possible to verify by insertion into equation (27) that:

$$(s_1 + \alpha^i)^3 = (s_1 + \alpha^i)^2 \cdot (s_1 + \alpha^i) =$$

$$= (\alpha^j + \alpha^k)^2 \cdot (\alpha^j + \alpha^k) =$$

$$= (\alpha^{2j} + \alpha^j \cdot \alpha^k + \alpha^j \cdot \alpha^k + \alpha^{2k}) \cdot (\alpha^j + \alpha^k) =$$

$$= (\alpha^{2j} + \alpha^{2k}) \cdot (\alpha^j + \alpha^k) =$$

$$= \alpha^{3j} + \alpha^{2j} \cdot \alpha^k + \alpha^{2k} \cdot \alpha^j + \alpha^{3k} =$$

$$= \alpha^{3j} + \alpha^{3k} + \alpha^j \cdot \alpha^k \cdot (\alpha^j + \alpha^k) =$$

$$= s_2 + \alpha^{3i} + \alpha^j \cdot \alpha^k \cdot (\alpha^j + \alpha^k).$$

In this case, it should be observed that addition modulo 2 of two equal values yields 0.

In the case of a 3-bit error in bit positions i, j and k, a comparison of a first value $(s_1 + \alpha^i)^3$ with a second value $s_2 + \alpha^{3i}$ yields the specified value $\alpha^j \alpha^k (\alpha^j + \alpha^k)$ if an error is corrected in the bit position i. If $(s_1 + \alpha^i)^3$ and $s_2 + \alpha^{3i}$ differ by a different value than $\alpha^j \alpha^k (\alpha^j + \alpha^k)$, there is no correction.

To be able to determine for the i-th bit position whether a 3-bit error, where the i-bit is erroneous and corrected, is present, for example the value $$\alpha^j \alpha^k (\alpha^j + \alpha^k) \quad (30)$$

is determined on the basis of the partial error syndromes and only the bit position i. The two further erroneous bit positions j and k need not be determined for the correction of the i-th bit position.

The value $(\alpha^j + \alpha^k)$ from equation (30) of the two further erroneous bit positions can be determined on the basis of the i-th bit position $\alpha^i$ and on the basis of the partial error syndrome $s_1$:

$$\alpha^j + \alpha^k = s_1 + \alpha^i$$

This follows immediately from equation (24).

The value $\alpha^j \alpha^k$ from equation (30) can be represented on the basis of the i-th bit position using the symmetric function $\sigma_2$ $$\sigma_2 = \alpha^i \alpha^j + \alpha^i \alpha^k + \alpha^j \alpha^k \quad (31)$$

as $$\alpha^j \alpha^k = \sigma_2 + \alpha^i \alpha^j + \alpha^i \alpha^k = \quad (32)$$

$$= \sigma_2 + \alpha^i \cdot (\alpha^j + \alpha^k) =$$

$$= \sigma_2 + \alpha^i \cdot (s_1 + \alpha^i)$$

Hence, the following arises from equation (27) in conjunction with equation (32) and equation (28):

$$(s_1+\alpha^i)^3 = s_2+\alpha^{3i}+(\sigma_2+\alpha^i(s_1+\alpha^i))\cdot(s_1+\alpha^i) \tag{33}$$

For $\sigma_2$, the following furthermore emerges by means of the partial error syndromes $s_1$, $s_2$ and $s_3$ as per equations (24), (25) and (26) which in turn are symmetric functions of the bit positions to be corrected:

$$\sigma_2 = \frac{s_1^2 \cdot s_2 + s_3}{s_1^3 + s_2}.$$

This can be verified by insertion into equations (24), (25) and 26.

Consequently, a common value of the symmetric function $\sigma_2$, which is determined by the syndrome components $s_1$, $s_2$ and $s_3$, can be used for all bit positions to be corrected.

By way of example, a binary correction value $\Delta_i$ for the i-th bit position in the case of a 3-bit error is determinable as per $$\Delta_i = 1 \text{ for } (s_1 + \alpha^i)^3 = s_2 + \alpha^{3i} + (\sigma_2 + \alpha^i(s_1 + \alpha^i))(s_1 + \alpha^i), \tag{34}$$
$$\Delta_i = 0 \text{ for } (s_1 + \alpha^i)^3 \neq s_2 + \alpha^{3i} + (\sigma_2 + \alpha^i(s_1 + \alpha^i))(s_1 + \alpha^i).$$

A first comparison value $(s_1+\alpha^i)^3$ is determined on the basis of the bit position i and the first partial error syndrome $s_1$. A second comparison value $s_2+\alpha^{3i}$ is determined on the basis of the bit position i and the second partial error syndrome $s_2$.

The bit position i is corrected with $\Delta_i=1$ if the comparison of the first comparison value to the second comparison value assumes a specified value, in this case the specified value $$(\alpha^j\alpha^k)(\alpha^j+\alpha^k) = (\sigma_2\alpha^i(s_1+\alpha^i))(s_1+\alpha^i) \tag{35}$$

The bit position i is not corrected, or is corrected with $\Delta_i=0$, if the comparison of the first comparison value to the second comparison value does not assume the specified value as per equation (35).

An advantage of the method presented here for forming a correction value for the i-th bit is, for example, that values that depend on the syndrome components can be formed and provided only once (e.g., centrally). Thus, for example the value $$s_1\sigma_2$$

can be determined once and can be provided for a plurality of bit positions. Advantageously, the formation of the term $s_1+\alpha^i$ does not require a component-by-component XOR operation. Instead, inverters can be used in simplified fashion to this end: The components of $s_1$ in which $\alpha^i$ equals 1 are inverted; components in which $\alpha^i$ equals 0 remain unchanged. Corresponding explanations apply to the addition of $\alpha^{3i}$.

Likewise, the value $$s_1^2+\sigma_2$$

need only be formed once and can be provided as an m-bit wide value for all bit positions to be corrected. In each bit position i to be corrected, all that still is required is a multiplication by the constant $\alpha^i$. For the i-th bit position, the value $s_1+\alpha^i$ can advantageously be realized by inverting the bits of the m-bit vector $s_1$ in which the bits of $\alpha^i$ equal 1. It is consequently possible to dispense with a component-by-component XOR operation, significantly reducing the outlay.

In an alternative embodiment, the rewritten form $$(\sigma_2+\alpha^i(s_1+\alpha^i))(s_1+\alpha^i) = s_1\sigma_2+\alpha^i(s_1^2+\sigma_2)+\alpha^{3i}$$

can be used. What then follows from equation (34) is that $$\Delta_i = 1 \text{ for } (s_1+\alpha^i)^3 = s_2+\alpha^{3i}+s_1\sigma_2+\alpha^i(s_1^2+\sigma_2)+\alpha^{3i}, \tag{36}$$
$$\Delta_i = 0 \text{ for } (s_1+\alpha^i)^3 \neq s_2+\alpha^{3i}+s_1\sigma_2+\alpha^i(s_1^2+\sigma_2)+\alpha^{3i}.$$

A further option consists, in equation (27), of representing the value $\alpha^j \cdot \alpha^k$ on the basis of the i-th bit position using a symmetric function $\sigma_3$ $$\sigma_3 = \alpha^i\alpha^j\alpha^k \tag{37}$$

as $$\alpha^j\alpha^k = \sigma_2 \cdot \alpha^{-i} \tag{38}$$

The following then emerges from equation (27):

$$(s_1+\alpha^i)^3 = s_2+\alpha^{3i}+\sigma_3 \cdot (s_1+\alpha^i) \cdot \alpha^{-i} \tag{39}$$

Using the partial error syndromes $s_1$, $s_2$ and the symmetric function $\sigma_2$, the symmetric function $\sigma_3$ can be represented by:

$$\sigma_3 = s_1^3 + s_2 s_1 \cdot \sigma_2 \tag{40}$$

This can be verified by inserting the values $s_1$, $s_2$ and $\sigma_2$.

If 1-bit errors, 2-bit errors and 3-bit errors should be corrected, it is an option, if a 1-bit error or a 2-bit error occurs, to determine a correction value $\Delta_i$ for the i-th bit such that $$\Delta_i = 1 \text{ for } (s_1+\alpha^i)^3 = s_2+\alpha^{3i} \tag{41}$$
$$\Delta_i = 0 \text{ for } (s_1+\alpha^i)^3 \neq s_2+\alpha^{3i}$$

applies, and that equation (34), for example, applies in the case of a 3-bit error.

In the case of a 1-bit error or a 2-bit error, a comparison value between $$(s_1+\alpha^i)^3$$

and $$s_2+\alpha^{3i}$$

is constant and identical for all bit positions. In the case of a 3-bit error, this comparison value is determined by the bit position i, and the values of the symmetric function $\sigma_2$ and the component of the error syndrome $s_1$, which are the same for all bit positions, because, in accordance with the explanations above, the additional term $(\sigma_2+\alpha^i(s_1+\alpha^i))(s_1+\alpha^i)$ is also added.

Even if a 2-bit error is present, the correction value $\Delta_i$ for the i-th bit can be determined according to equation (34), because for the 2-bit error in bit positions i and j with $$\sigma_2 = \frac{s_3 + s_1^2 s_3}{s_1^3 + s_2},$$

$$s_1 = \alpha^i + \alpha^j,$$

-continued $$s_2 = \alpha^{3i} + \alpha^{3j},$$
$$s_3 = \alpha^{5i} + \alpha^{5j}$$

$\sigma_2$ is determined as
$\sigma_2 = \alpha^i \cdot \alpha^j$
Hence, $$(\sigma_2 + \alpha^i(s_1 + \alpha^i))(s_1 + \alpha^i) = 0$$

and in the case of a 2-bit error, the correction value is determinable by $$(s_1 + \alpha^i)^3 + s_2 + \alpha^{3i}$$

as required.

Whether there is no error or whether there is a 1-bit error or whether there is a 2-bit error or whether there is a 3-bit error can be determined using the error syndrome components $s_1$, $s_2$, $s_3$ and $s_4 = s_P$:

If no error is present, all error syndrome components $s_1$, $s_2$, $s_3$ and $s_4 = s_P$ are equal to 0. Otherwise an error is present.

If a 1-bit error is present, $s_1^3 = s_2$ and $s_P = 1$ then and applies.

If a 2-bit error is present, $s_P = 0$ then $s_1^3 \neq s_2$ and applies.

If a 3-bit error is present, $s_P = 1$ and $s_1^3 \neq s_2$ applies.

Even though the invention was illustrated more closely and described in detail by the at least one exemplary embodiment shown, the invention is not restricted thereto, and other variations can be derived herefrom by a person skilled in the art without departing from the scope of protection of the invention.

What is claimed is:

1. A computer implemented method for processing a bit sequence in a device comprising a first hardware comparison value generator and a second hardware comparison value generator, the computer implemented method comprising:
    providing an error syndrome for the bit sequence, the error syndrome having an error syndrome bit length,
    determining a first partial error syndrome of the error syndrome, the first partial error syndrome having a first bit length less than the error syndrome bit length,
    determining a second partial error syndrome of the error syndrome, the second partial error syndrome having a second bit length less than the error syndrome bit length,
    in the first hardware comparison value generator, determining a first comparison value based on a bit position in the bit sequence and the first partial error syndrome,
    in a second hardware comparison value generator, determining a second comparison value based on the bit position and the second partial error syndrome, and
    changing a bit value at the bit position to a corrected bit value only when a comparison of the first comparison value with the second comparison value is a specified value, and otherwise leaving the bit value at the bit position.

2. The computer implemented method of claim 1, wherein the changing of the bit value to the corrected bit value uses an error code capable of correcting at least a 2-bit error.

3. The computer implemented method of claim 2, wherein the error code is a Bose-Chaudhuri-Hocquenghem (BCH) code.

4. The computer implemented method of claim 1, wherein the bit value is changed to the corrected bit value when the first comparison value equals the second comparison value.

5. The computer implemented method of claim 1, wherein the first partial error syndrome $s_1$ and the second partial error syndrome $s_2$ each have m components of the error syndrome and m>2.

6. The computer implemented method of claim 1,
    wherein the bit value is assigned a value $\beta$, the first partial error syndrome is assigned $s_1$, and the second partial error syndrome is assigned $s_2$,
    wherein the first comparison value is determined as $(s_1 + \beta)^k$ and the second comparison value is determined as $s_2 + \beta^k$,
    wherein $k \neq 0$, and $s_1$, $s_2$ and $\beta$ are elements of a Galois field.

7. The computer implemented method of claim 6, wherein the Galois field is $GF(2^m)$ and m>2.

8. The computer implemented method of claim 6,
    wherein r bit positions $i_0, i_1, \ldots, i_{r-1}$ of the bit sequence are assigned r values $\alpha^{i_0}, \alpha^{i_1}, \alpha^{i_2}, \alpha^{i_{r-1}}$,
    wherein first comparison values $$[s_1 + \alpha^{i_0}]^k,$$
$$[s_1 + \alpha^{i_1}]^k,$$
$$[s_1 + \alpha^{i_2}]^k,$$
$$\vdots$$
$$[s_1 + \alpha^{i_{r-1}}]^k$$

and second comparison values $$s_2 + [\alpha^{i_0}]^k,$$
$$s_2 + [\alpha^{i_1}]^k,$$
$$s_2 + [\alpha^{i_2}]^k,$$
$$\vdots$$
$$s_2 + [\alpha^{i_{r-1}}]^k$$

are determined for bit positions to be corrected,
    wherein $r \geq 1$ and a is a generator of the Galois field.

9. The computer implemented method of claim 6, wherein k=3 or k=−1.

10. The computer implemented method of claim 1 for error correction of a 2-bit error at bit positions i and j,
    wherein the first partial error syndrome is assigned $s_1$ and is determined as $$i\ s_1 = \alpha^i + \alpha^j$$

wherein the second partial error syndrome is assigned $s_s$ and is determined as $$s_2 = \alpha^{k \cdot i} + \alpha^{k \cdot j}$$

wherein the comparison supplies a correction signal for correcting the i-th bit,
    wherein the correction signal is determined such that it assumes a first value if $$(s_1 + \alpha^i)^k = s_2 + \alpha^{k \cdot i}$$

applies, and assumes a second value if $$(s_1 \alpha^i)^k \neq s_2 + \alpha^{k \cdot i}$$

applies, wherein $\alpha^i$, $\alpha^j$, $\alpha^{k \cdot i}$, $\alpha^{k \cdot j}$ are elements of a Galois field $GF(2^m)$, $m \geq 3$ and k is an integer not equal to 0, and + denotes addition in the Galois field.

11. The computer implemented method of claim 10, further comprising: determining a plurality of correction signals, in each case one for a different bit, and wherein the plurality of correction signals are at least partially determined with overlapping timing.

12. The computer implemented method of claim 10, wherein different correction signals are determined by means of different components.

13. The computer implemented method of claim 10, wherein the first comparison value and the second comparison value are at least partially determined simultaneously by the first hardware comparison value generator and the second hardware comparison value generator, respectively.

14. The computer implemented method of claim 1, further comprising: determining a third partial error syndrome.

15. The computer implemented method of claim 14, wherein the third partial error syndrome is a syndrome of a 3-bit error-correcting Bose-Chaudhuri-Hocquenghem (BCH) code.

16. The computer implemented method of claim 14, wherein the specified value in correction of a 2-bit error is constant.

17. The computer implemented method of claim 15, wherein, in correction of a 3-bit error, the specified value is determined based on the respective bit position to be corrected.

18. The computer implemented method of claim 14, wherein, when the corrected bit value corrects an erroneous first bit of a 3-bit error, the specified value equals a value of a product of: a second bit position, a third bit position, and a sum of the second bit position and the third bit position; where the second bit position represents a position of a second bit error and the third bit position represents a position of a third bit error, and where the product and the sum of the bit positions are determined in a Galois field $GF(2^m)$.

19. The computer implemented method of claim 18, wherein the specified value is determined based on a symmetric function of the erroneous bit positions.

20. The computer implemented method of claim 19, wherein the symmetric function is determined using partial error syndromes of a Bose-Chaudhuri-Hocquenghem (BCH) code.

21. The computer implemented method of claim 14, further comprising: determining a parity for the bit sequence.

22. The computer implemented method of claim 21, wherein the specified value is constant if the parity of the bit sequence equals 0 and the first partial error syndrome $s_1$ is not equal to 0.

23. The computer implemented method of claim 21, wherein the specified value is constant if the parity of the bit sequence equals 1 and $s_1^3 = s_2$, where $s_1$ is the first partial error syndrome and $s_2$ is the second partial error syndrome.

24. A device configured to:
processing a bit sequence that corresponds to an error syndrome,
determine a first partial error syndrome $s_1$ of the error syndrome, and
determine a second partial error syndrome $s_2$ of the error syndrome,
the device comprising:
a first hardware comparison value generator configured to determine a first comparison value based on a bit position and the first partial error syndrome, and
a second hardware comparison value generator configured to determine a second comparison value based on the bit position and the second partial error syndrome, wherein the second hardware comparison value generator is configured to determine the second comparison value at least partially simultaneously when the first hardware comparison value generator determines the first comparison value;
the device further configured to correct a bit value at the bit position to a corrected bit value only when a comparison between the first comparison value and the second comparison value assumes a specified value.

25. The device of claim 24, wherein the device comprises a plurality of processing units and/or circuits configured to correct or not correct bit values at corresponding bit positions at least in part in simultaneous fashion.

26. The device of claim 25, wherein the device is part of a memory or a memory system or is separate from the memory or the memory system.

* * * * *